United States Patent
Ning

(10) Patent No.: US 11,430,709 B2
(45) Date of Patent: Aug. 30, 2022

(54) SEMICONDUCTOR DEVICE

(71) Applicant: CHANGXIN MEMORY TECHNOLOGIES, INC., Hefei (CN)

(72) Inventor: Shuliang Ning, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 0 days.

(21) Appl. No.: 17/389,636

(22) Filed: Jul. 30, 2021

(65) Prior Publication Data

US 2022/0020657 A1  Jan. 20, 2022

Related U.S. Application Data

(63) Continuation of application No. PCT/CN2020/136391, filed on Dec. 15, 2020.

(30) Foreign Application Priority Data

Jul. 17, 2020 (CN) .......................... 202010689795.7

(51) Int. Cl.
*H01L 23/34* (2006.01)
*H01L 25/065* (2006.01)
(Continued)

(52) U.S. Cl.
CPC ............... *H01L 23/34* (2013.01); *G11C 5/04* (2013.01); *G11C 7/04* (2013.01);
(Continued)

(58) Field of Classification Search
CPC ............... H01L 23/34; H01L 25/0657; H01L 2225/06589; G11C 5/04; G11C 7/04; G11C 11/40626; G11C 29/028
See application file for complete search history.

(56) References Cited

U.S. PATENT DOCUMENTS

| 7,107,178 B2 | 9/2006 | Won | |
|---|---|---|---|
| 7,266,031 B2* | 9/2007 | Kim | G11C 7/04 365/230.06 |

(Continued)

FOREIGN PATENT DOCUMENTS

| CN | 101017708 A | 8/2007 |
|---|---|---|
| CN | 101162604 A | 4/2008 |

(Continued)

OTHER PUBLICATIONS

International Search Report in the international application No. PCT/CN2020/136391, dated Apr. 6, 2021, 2 pgs.

(Continued)

*Primary Examiner* — Tri M Hoang

(74) *Attorney, Agent, or Firm* — Cooper Legal Group, LLC

(57) ABSTRACT

A semiconductor device is provided, including multiple memory chips and a temperature detection module. The temperature detection circuit includes: multiple temperature sensitive units, arranged on the memory chips to detect temperatures of the memory chips; and a processing unit. The multiple temperature sensitive units share the processing unit with each other. The processing unit is configured to process a signal of at least one of the temperature sensitive units. The processing unit includes a calibration value memory cell and a calibration unit. The calibration value memory cell is configured to store a calibration value corresponding to the temperature sensitive unit. The calibration unit is configured to calibrate the temperature sensitive unit according to the calibration value.

20 Claims, 3 Drawing Sheets

(51) Int. Cl.
*G11C 5/04* (2006.01)
*G11C 7/04* (2006.01)
*G11C 11/406* (2006.01)

(52) U.S. Cl.
CPC .... *G11C 11/40626* (2013.01); *H01L 25/0657* (2013.01); *H01L 2225/06589* (2013.01)

(56) References Cited

U.S. PATENT DOCUMENTS

| | | | |
|---|---|---|---|
| 7,383,149 B1* | 6/2008 | Walker | G01R 31/2874 |
| | | | 702/130 |
| 7,480,588 B1* | 1/2009 | Walker | G01K 7/425 |
| | | | 702/132 |
| 7,554,869 B2 | 6/2009 | Kim | |
| 7,606,099 B2 | 10/2009 | Chung | |
| 7,643,889 B2 | 1/2010 | Jeong | |
| 8,801,279 B2* | 8/2014 | Kim | H01L 25/0657 |
| | | | 374/170 |
| 9,013,932 B1 | 4/2015 | Lee | |
| 9,194,754 B2* | 11/2015 | Walker | H03K 17/687 |
| 9,465,757 B2* | 10/2016 | Son | G06F 13/1689 |
| 9,520,189 B1* | 12/2016 | Papandreou | G11C 13/0033 |
| 9,530,766 B2 | 12/2016 | Ishihara et al. | |
| 9,587,994 B2* | 3/2017 | Yayama | G01K 7/01 |
| 9,927,986 B2* | 3/2018 | Hodes | G06F 3/0679 |
| 10,679,711 B2 | 6/2020 | Matsumoto | |
| 2005/0105367 A1 | 5/2005 | Kim | |
| 2005/0146965 A1 | 7/2005 | Kim | |
| 2006/0066384 A1 | 3/2006 | Jain | |
| 2006/0290366 A1 | 12/2006 | Kon | |
| 2007/0247944 A1 | 10/2007 | Fischer | |
| 2008/0018377 A1 | 1/2008 | Chung | |
| 2008/0091378 A1 | 4/2008 | Jeong | |
| 2009/0085647 A1 | 4/2009 | Hwang | |
| 2011/0279168 A1 | 11/2011 | Lee | |
| 2013/0060499 A1 | 3/2013 | Yoshimura | |
| 2015/0043266 A1 | 2/2015 | Youn | |
| 2015/0124544 A1 | 5/2015 | Lee | |
| 2016/0133314 A1 | 5/2016 | Hwang et al. | |
| 2016/0141284 A1 | 5/2016 | Ishihara et al. | |
| 2018/0166123 A1* | 6/2018 | Goto | G11C 7/04 |
| 2018/0293029 A1 | 10/2018 | Achtenberg et al. | |
| 2019/0096473 A1 | 3/2019 | Park | |
| 2019/0295663 A1 | 9/2019 | Matsumoto | |
| 2020/0142799 A1* | 5/2020 | Hiruta | G06F 11/3037 |
| 2020/0159465 A1 | 5/2020 | Achtenberg et al. | |
| 2020/0333194 A1 | 10/2020 | Huh | |
| 2021/0247241 A1 | 8/2021 | Nagata | |
| 2021/0362492 A1 | 11/2021 | Gardner et al. | |
| 2022/0006427 A1 | 1/2022 | Sugimoto | |

FOREIGN PATENT DOCUMENTS

| | | |
|---|---|---|
| CN | 104807561 A | 7/2015 |
| CN | 105474543 A | 4/2016 |
| CN | 107393577 A | 11/2017 |
| CN | 208953151 U | 6/2019 |
| CN | 110299171 A | 10/2019 |
| CN | 212303077 U | 1/2021 |
| CN | 212303078 U | 1/2021 |
| CN | 212303079 U | 1/2021 |

OTHER PUBLICATIONS

International Search Report in the international application No. PCT/CN2020/136390, dated Apr. 16, 2021, 2 pgs.
International Search Report in the international application No. PCT/CN2020/136388, dated Apr. 8, 2021, 3 pgs.
First Office Action of the U.S. Appl. No. 17/389,618, dated Apr. 11, 2022, 24 pgs.
First Office Action of the U.S. Appl. No. 17/389,629, dated Apr. 22, 2022, 22 pgs.
Supplementary European Search Report in the European application No. 20937168.1, dated Jun. 13, 2022, 8 pgs.

* cited by examiner

SEMICONDUCTOR DEVICE

CROSS-REFERENCE TO RELATED APPLICATIONS

This is a continuation application of International Patent Application No. PCT/CN2020/136391, filed on Dec. 15, 2020, which claims priority to Chinese Patent Application No. 202010689795.7, filed on Jul. 17, 2020, entitled "Semiconductor Device". The disclosures of International Patent Application No. PCT/CN2020/136391 and Chinese Patent Application No. 202010689795.7 are incorporated by reference herein in their entireties.

TECHNICAL FIELD

The disclosure relates to the field of memories, and particularly to a semiconductor device.

BACKGROUND

Dynamic Random Access Memory (DRAM) is a semiconductor memory device commonly used in computers, and a memory array area thereof consists of many duplicated memory cells. Each memory cell usually includes a capacitor and a transistor. A gate of the transistor is connected with a word line, a drain of the transistor is connected with a bit line, and a source of the transistor is connected with the capacitor. A voltage signal on the word line may control the transistor to be turned on or turned off to further read data information stored in the capacitor through the bit line or write, through the bit line, data information into the capacitor for storage.

The temperature has a great influence on the writing into the memory. When a memory is written in a low-temperature environment, there are such problems of relatively long writing time and low writing stability.

SUMMARY

The technical problem to be solved by the present disclosure is to provide a semiconductor device, which may detect a temperature of a memory chip, prevent the memory chip from being started or run at a low temperature, shorten writing time and improve the writing stability of the memory chip. In addition, a temperature detection module is simple in circuit structure and easy to implement. Temperature sensitive units share a processing unit with each other, so that the temperature detection module occupies a small area, which will not affect an effective area of the memory chip. Moreover, the temperature sensitive units may be calibrated accurately to improve the temperature detection accuracy.

In order to solve the above mentioned problems, according to a first aspect of the disclosure, a semiconductor device is provided, which includes multiple memory chips and a temperature detection circuit. The temperature detection circuit includes: multiple temperature sensitive elements, arranged on the memory chips to detect temperatures of the memory chips; and a processor. The multiple temperature sensitive elements share the processor with each other. The processor is configured to process a signal of at least one of the temperature sensitive elements. The processor includes a calibration value memory cell and a calibrator. The calibration value memory cell is configured to store a calibration value corresponding to the temperature sensitive element. The calibrator is configured to calibrate the temperature sensitive element according to the calibration value.

Furthermore, the calibrator may be an adjustable resistor, and may be connected in parallel with the temperature sensitive elements, and the calibrator may be adjusted to a resistance value corresponding to the temperature sensitive element according to the calibration value to calibrate the temperature sensitive element.

Furthermore, the calibrator may include multiple sub-resistors and multiple switches. The sub-resistors may be connected in series. Each of the switches is connected with at least one of the sub-resistors. The resistance value of the calibrator is changed by changing on/off states of the multiple switches.

Furthermore, the on-off state of the switch may be controlled according to the calibration value.

Furthermore, the temperature sensitive element may be a diode. The diode has a negative terminal electrically connected with a ground terminal and a positive terminal electrically connected with the processor. The calibrator may be connected in parallel with the temperature sensitive element. The calibrator has a terminal electrically connected with the ground terminal and an another terminal electrically connected with the positive terminal of the diode.

Furthermore, the temperature detection circuit may further include a non-volatile memory cell, connected with the calibration value memory cell and configured to back up the calibration value. When the semiconductor device is powered on, the calibration value backed up in the non-volatile memory cell may be stored in the calibration value memory cell.

Furthermore, the processor may include at least one control switch, and the control switch may be electrically connected with the temperature sensitive element to control an on-off of the temperature sensitive element.

Furthermore, the processor may further include a fixed resistor. The fixed resistor has a first terminal electrically connected with a power source and a second terminal electrically connected with the control switch.

Furthermore, the processor may further include an Analog/Digital (A/D) conversion circuit. The A/D conversion circuit has an input terminal electrically connected with the second terminal of the fixed resistor and an output terminal configured to output a digital signal, and the A/D conversion circuit is configured to convert an analog signal of the second terminal of the fixed resistor into a digital signal.

Furthermore, the A/D conversion circuit may include: a resistor set and multiple comparators. The resistor set has a first terminal and a second terminal. The first terminal of the resistor set is electrically connected with the power source, and the second terminal of the resistor set is electrically connected with the ground terminal. The resistor set has multiple leading-out terminals and voltages of the leading-out terminals are different. A signal of the input terminal of the A/D conversion circuit is taken as an input signal of the comparator, signals of the multiple leading-out terminals of the resistor set mare taken as reference signals of the multiple comparators respectively, and the comparators output digital signals.

Furthermore, the A/D conversion circuit may further include a encoder. The encoder receives and codes the output signal of the comparator.

Furthermore, the A/D conversion circuit may further include an output device. The output device is connected with the comparator, and is configured to output the digital signal.

Furthermore, the resistor set may include multiple sub-resistors connected in series, and the numbers of the sub-resistors between respective leading-out terminals of the resistor set and the second terminal of the resistor set are different from each other, so that the voltages of the respective leading-out terminals are different from each other.

Furthermore, the temperature sensitive elements may correspond to the memory chips one to one. Each of memory chips is provided with one of the temperature sensitive elements.

Furthermore, the temperature sensitive element may share a same ground terminal with the memory chip.

Furthermore, the semiconductor device may further include a control chip. The memory chips and the temperature detection circuit may be electrically connected with the control chip.

Furthermore, the processor may be arranged on the control chip or arranged on one of the memory chips.

Furthermore, the multiple memory chips may be sequentially stacked upwards on the control chip.

Furthermore, the semiconductor device may further include a circuit substrate. A connecting circuit may be formed in the circuit substrate, both the memory chip and the control chip may be arranged on the circuit substrate, and the memory chip may be connected with the control chip by the connecting circuit in the circuit substrate.

Furthermore, the control chip may be configured to heat a memory chip before the memory chip is started, and to determine whether a temperature detected by the temperature sensitive element reaches a set threshold or not, and the control chip may be configured to control the memory chip to start when the temperature detected by the temperature sensitive element reaches the set threshold.

Furthermore, a power supply of the temperature sensitive element and a power supply of the memory chip may be implemented by different power sources.

Furthermore, the power supply of the temperature sensitive element may be earlier than the power supply of the memory chip.

DETAILED DESCRIPTION

Embodiments of a semiconductor device provided in the disclosure will be described below in detail in combination with the drawings.

As described in BACKGROUND, the temperature has a great influence on the writing into the memory. When a memory is written in a low-temperature environment, there are such problems of relatively long writing time and low writing stability.

Researches show that, when an existing memory works in a low-temperature environment, a temperature drop may increase resistance of a bit line, word line, metal connecting wire (metal contact portion), etc., in the memory, and increase of the resistance may change or prolong time for writing data into the memory, thereby influencing the writing stability of the memory.

Therefore, the disclosure provides a semiconductor device. A temperature of a memory chip is detected by a temperature sensitive unit to provide a reference for enabling and running the memory chip, so that the memory chip is prevented from being started and run at a low temperature, writing time is shortened, and the writing stability of the memory chip is improved. In addition, the semiconductor device of the disclosure may also be self-calibrated, so that the temperature detection accuracy is greatly improved.

Figure 1:
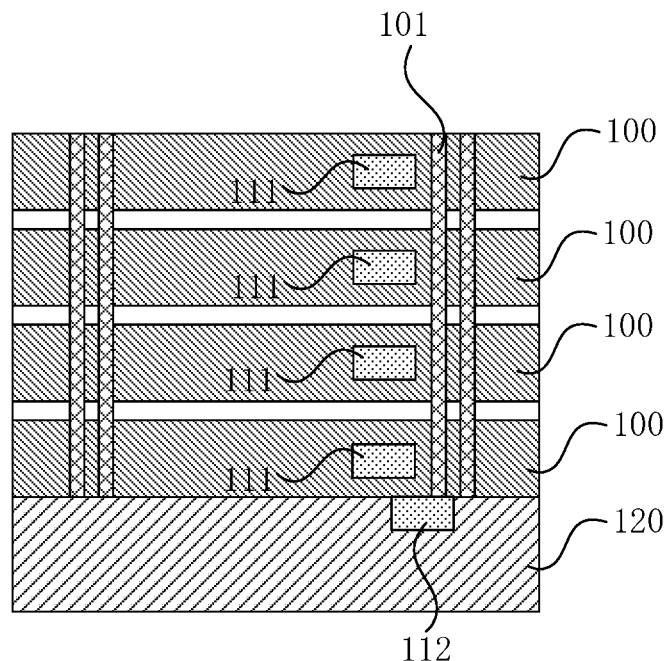
FIG. 1 is a structure diagram of a semiconductor device according to a first embodiment of the disclosure.
Figure 2:
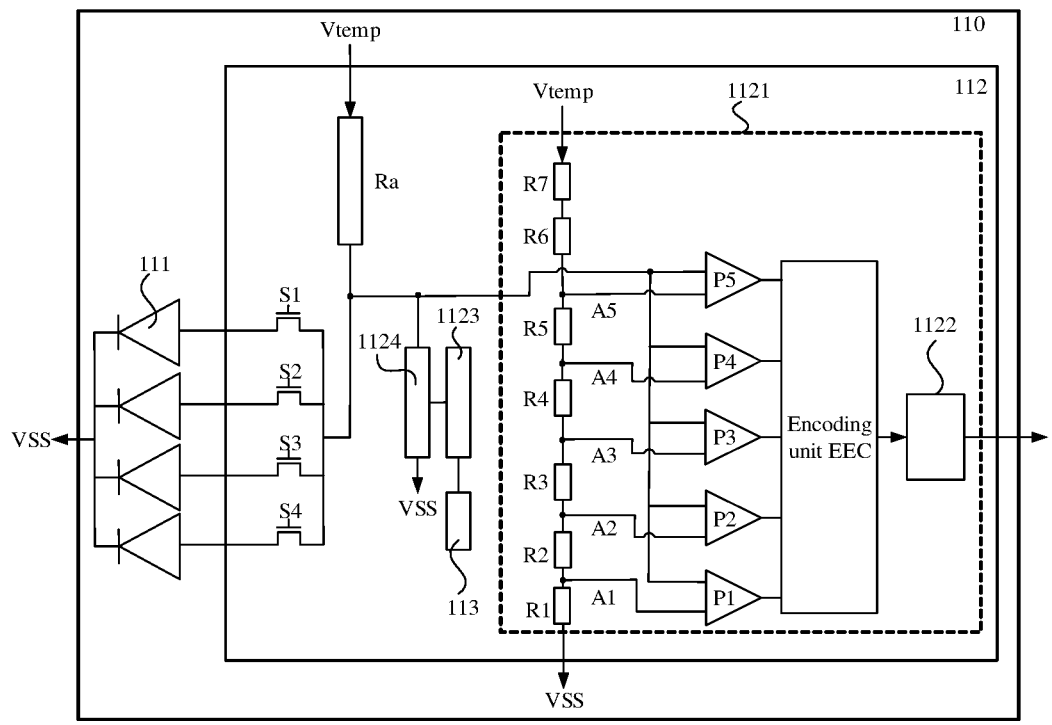
FIG. 2 is a circuit diagram of a temperature detection module in a semiconductor device according to the disclosure.

FIG. 1 is a structure diagram of a semiconductor device according to a first embodiment of the disclosure. FIG. 2 is a circuit diagram of a temperature detection module in a semiconductor device according to the disclosure. Referring to FIG. 1 and FIG. 2, the semiconductor device of the disclosure includes multiple memory chips 100 and a temperature detection module 110.

Furthermore, the semiconductor device further includes a control chip 120, and the memory chips 100 and the temperature detection module 110 are electrically connected with the control chip 120. The control chip 120 is configured to control starting and running of the memory chip 100 and the temperature detection module 110. Starting of the memory chip 100 includes power-on and self-detection, and running of the memory chip 100 includes writing data into the memory chip 100, reading data from the memory chip 100, deleting data stored in the memory chip 100, etc. It is to be noted that, in the embodiment of the disclosure, the function of the control chip 120 in terms of controlling starting of the memory chip 100, etc., may also be realized by arranging a control circuit in the memory chip 100, and in such case, the control chip 120 may not be required. It is understood by those of ordinary skill in the art that the control chip may be arranged as required.

The memory chip 100 is an existing memory, into which data can be written, from which data can be read and/or from which data can be deleted, and the memory chip 100 is formed by a semiconductor integration manufacturing process. Specifically, the memory chip 100 may include a memory array and a peripheral circuit connected with the memory array, the memory array includes multiple memory cells, and bit lines, word lines and metal connecting wires (metal contact portion) connected with the memory cells. The memory cell is configured to store data, and the peripheral circuit is a related circuit when the memory array is operated. In the embodiment, the memory chip 100 is a DRAM memory chip, the DRAM memory chip includes multiple memory cells, the memory cell usually includes a capacitor and a transistor, a gate of the transistor is connected with the word line, a drain of the transistor is connected with the bit line, and a source of the transistor is connected with the capacitor. In another embodiment, the memory chip 100 may be a memory chip of another type.

The temperature detection module 110 includes multiple temperature sensitive units 111 and a processing unit 112.

The multiple temperature sensitive units 111 are arranged on at least part of the memory chips 100 to detect temperatures of at least part of the memory chips 100 and output analog signals corresponding to the temperatures. When the temperature detected by the temperature sensitive unit 111 reaches a set threshold, the control chip 120 controls the memory chip 100 to start. A specific value of the set threshold may be set according to a practical requirement or experiences.

There may be a one-to-one correspondence or a one-to-many correspondence between the temperature sensitive units 111 and the memory chips 100.

When there are multiple memory chips 100 and there are also multiple temperature sensitive units 111, and the number of the temperature sensitive units 111 is the same as the number of the memory chips 100, the temperature sensitive units 111 and the memory chips 100 have the one-to-one correspondence with each other. In this case, one temperature sensitive unit 111 is arranged in one memory chip 100, and is configured to detect the temperature of the memory chip 100. Specifically, in the embodiment, there are multiple memory chips 100 and multiple temperature sensitive units 111, as shown in FIG. 1, which schematically shows four memory chips 100 and four temperature sensitive units 111. The multiple memory chips 100 are stacked on each other, and the temperature sensitive units 111 are arranged in a manner of corresponding to the memory chips 100 one to one, and are configured to detect temperatures of the memory chips 100.

When there are multiple memory chips 100 and multiple temperature sensitive units 111, but the number of the temperature sensitive units 111 is less than the number of the memory chips 100, the temperature sensitive units 111 and the memory chips 100 may have the one-to-one correspondence and the one-to-many correspondence at the same time, or may have the one-to-many correspondence only. That is, there is a case where one temperature sensitive unit 111 detects the temperature of one memory chip 100 and one temperature sensitive unit 111 detects the temperatures of multiple memory chips 100, or there is only a case where one temperature sensitive unit 111 detects the temperatures of multiple memory chips 100.

Figure 3:
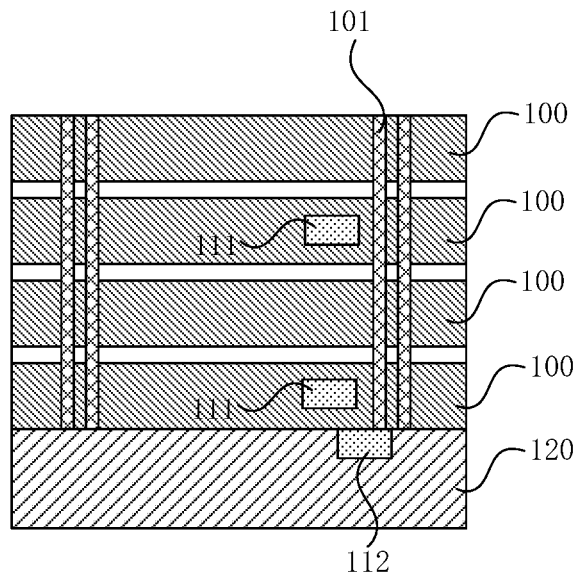
FIG. 3 is a structure diagram of a semiconductor device according to a second embodiment of the disclosure.

Furthermore, the temperature sensitive unit 111 may be formed in the memory chip 100 through the semiconductor integration manufacturing process. The temperature sensitive unit 111 may be formed in the memory chip when the temperature sensitive unit 111 is configured to only detect the temperature of one memory chip 100. For example, in the embodiment, as shown in FIG. 1, the temperature sensitive units 111 correspond to the memory chips 100 one to one, in which one temperature sensitive unit 111 is arranged in each memory chip 100. The temperature sensitive unit 111 may be formed in any one of the multiple memory chips 100 or formed in the middle or bottom memory chip 100 when the temperature sensitive unit is configured to detect the temperatures of multiple memory chips 100. For example, in a second embodiment of the disclosure, referring to FIG. 3, which shows a structure diagram of a semiconductor device according to a second embodiment of the disclosure, the temperature sensitive units 111 are arranged in the bottom memory chip 100 and the middle third memory chip 100, and may detect temperatures of four memory chips 100.

The multiple temperature sensitive units 111 share the processing unit 112 with each other, and the processing unit 112 is configured to process a signal of at least one of the temperature sensitive units 111.

The multiple temperature sensitive units 111 of the semiconductor device of the disclosure share the processing unit 112 with each other, so that an area occupied by the temperature detection module is greatly reduced, without affecting an effective area of the memory chip.

The semiconductor device of the disclosure includes the multiple temperature sensitive units 111. When multiple temperature sensitive units 111 are calibrated with a same calibration value, errors may be generated. Therefore, different temperature sensitive units 111 of the semiconductor device of the disclosure are calibrated in a targeted manner, and the temperature detection accuracy is greatly improved.

Specifically, continuing to referring to FIG. 2, the processing unit 112 includes a calibration value memory cell 1123 and a calibration unit 1124. The calibration value memory cell 1123 is configured to store a calibration value corresponding to the temperature sensitive unit 111. For example, in the embodiment, the temperature detection module 110 includes four temperature sensitive units 111. In such case, each temperature sensitive unit 111 corresponds to a calibration value. The calibration unit 1124 is configured to calibrate the temperature sensitive unit 111 according to the calibration value. For example, when the processing unit 112 processes a signal of a first temperature sensitive unit 111, the calibration unit 1124 calibrates the first temperature sensitive unit 111 according to a calibration value corresponding to the first temperature sensitive unit 111. When the processing unit 112 processes a signal of a second temperature sensitive unit 111, the calibration unit 1124 calibrates the second temperature sensitive unit 111 according to a calibration value corresponding to the second temperature sensitive unit 111. The rest may be deduced by analogy. Therefore, the purpose that different temperature sensitive units 111 are calibrated in a targeted manner may be achieved, thereby avoiding calibration errors, and improving the temperature measurement accuracy.

Furthermore, the control chip 120 may control the calibration unit 1124 to calibrate the temperature sensitive unit 111 according to the calibration value stored in the calibration value memory cell 1123.

In the first embodiment, the calibration unit 1124 is an adjustable resistor, and is connected in parallel with the temperature sensitive units 111. The control chip 120 may control the calibration unit 1124 according to the calibration value, to adjust a resistance value thereof to an appropriate resistance value corresponding to the temperature sensitive unit 111, thereby calibrating the temperature sensitive unit 111. It can be understood that, in the embodiment, the calibration value is a resistance value, and each temperature sensitive unit 111 corresponds to a resistance value.

Figure 4:
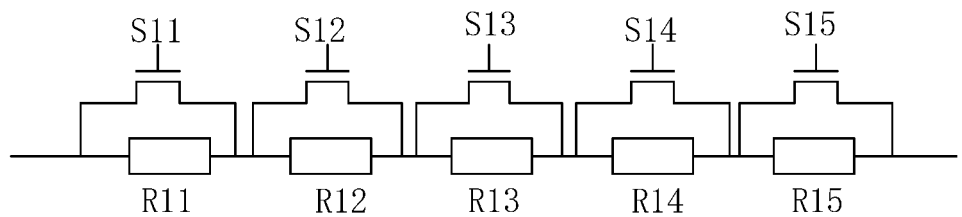
FIG. 4 is a circuit diagram of an example of an adjustable resistor.

A circuit structure of the adjustable resistor is specified in the embodiment. Referring to FIG. 4, which shows a circuit diagram of an example of an adjustable resistor, the adjustable resistor includes multiple sub-resistors R1$n$ and multiple switches S1$n$. The sub-resistors R1$n$ are connected in series, each switch S1$n$ at least is connected with one of the sub resistors R1$n$, and on/off states of the multiple switches S1$n$ may be changed to change the resistance value of the adjustable resistor.

In the embodiment, sub-resistors R11 to R15 and switches S11 to S15 are schematically shown. Each sub-resistor is connected in parallel with one switch. Specifically, the sub-resistor R11 is connected in parallel with the switch S11, the sub-resistor R12 is connected in parallel with the switch S12, the sub-resistor R13 is connected in parallel with the switch S13, the sub-resistor R14 is connected in parallel with the switch S14, and the sub-resistor R15 is connected in parallel with the switch S15. In another embodiment of the disclosure, two or more than two sub resistors may be connected in parallel with one switch after connected in series. For example, the sub-resistor R11 and the sub-resistor R12 connected in series are connected in parallel with the switch S11, or the sub-resistor R11, the sub-resistor R12 and the sub-resistor R13 connected in series are connected in parallel with the switch S11.

The switch S1n is controlled to be turned on/off according to the calibration value to change the resistance value of the adjustable resistor. When a resistance value corresponding to the calibration value is greater than a present resistance value of the adjustable resistor, namely the resistance value of the adjustable resistor is needed to be increased, the switch S1n is switched off such that the sub-resistor connected in parallel therewith is connected to a circuit. When the resistance value corresponding to the calibration value is less than the present resistance value of the adjustable resistor, namely the resistance value of the adjustable resistor needs to be decreased, the switch 1n is switched on such that the switch S1n is connected to the circuit and the sub-resistor connected therewith is short-circuited. For example, in the embodiment, when the resistance value of the adjustable resistor needs to be increased, the switch S11 is switched off such that the sub-resistor R11 connected in parallel with the switch S11 is connected to the circuit. When the resistance value of the adjustable resistor needs to be decreased, the switch 11 is switched on such that the switch S11 is connected to the circuit and the sub-resistor R11 connected therewith is short-circuited.

Furthermore, in the embodiment, the sub-resistors R1n have the same resistance value, so that the pattern layout difficulty may be reduced, and the pattern layout is simple and easy to implement, which facilitates manufacturing. The sub-resistor R1n is a polyresistor or an N-diffused resistor or a P-diffused resistor. Furthermore, the sub-resistors R1n are electrically connected with each other through a first layer of metal wires, and the sub resistors R1n are electrically connected with the switches S1n through a second layer of metal wires. In such a manner, the manufacture may be easily achieved and the stability and the accuracy may be improved.

Furthermore, the switch S1n may be a transistor, such as an NMOS transistor or a PMOS transistor, which is stable in structure and easy to manufacture.

The above is only an embodiment of an adjustable resistor unit 1111 provided in the disclosure. In another embodiment of the disclosure, the adjustable resistor unit 1111 may also be implemented by another circuit structure.

Furthermore, the temperature detection module 110 further includes a non-volatile memory cell 113. The non-volatile memory cell 113 is connected with the calibration value memory cell 1123, and is configured to back up the calibration value. The non-volatile memory cell 113 may back up the calibration value according to a preset period. The preset period may be a preset time period after the semiconductor device is powered on. For example, the calibration value is backed up in the non-volatile memory cell 113 by taking 10 minutes as a period after the semiconductor device is powered on, namely the calibration value is backed up in the non-volatile memory cell every ten minutes after the semiconductor device is powered on. Alternatively, the calibration value is backed up in the non-volatile memory cell by taking an hour as a period, namely the calibration value is backed up in the non-volatile memory cell 113 every hour after the semiconductor device is powered on. The non-volatile memory cell 113 may also store the calibration value during factory setting of the chip. The semiconductor device imports the calibration value in the non-volatile memory cell 113 into the calibration value memory cell 1123 at first every time when the semiconductor device is subsequently powered on for use.

The semiconductor device of the disclosure backs up the calibration value in the non-volatile memory cell 113, and when a power failure of the semiconductor device, the calibration value may still be recorded in the non-volatile memory cell 113 as a basis for subsequent calibration, and may not be cleared.

The calibration value backed up in the non-volatile memory cell 113 may be reloaded into the calibration value memory cell 1123. The loaded calibration value is used as a reference for subsequent calibration, so that calibration value loss caused by the power failure of the semiconductor device may be avoided.

Furthermore, the processing unit 112 includes at least one control switch Sx. The control switch Sx is electrically connected with the temperature detection unit 111 to select the temperature detection unit 111 with a signal needing to be processed by the processing unit 112. Specifically, when the control switch Sx is closed, the temperature sensitive unit 111 is electrically connected with the processing unit 112, and when the control switch Sx is opened, an electrical connection between the temperature sensitive unit 111 and the processing unit 112 is released.

In the first embodiment, the temperature sensitive unit 111 is a diode. A negative terminal of the diode is electrically connected with a ground terminal VSS, and a positive terminal of the diode is electrically connected with the processing unit 112 through the control switch Sx. The calibration unit 1124 is connected in parallel with the diodes. One terminal of the calibration unit 1124 is electrically connected with the ground terminal VSS, while an another terminal of the calibration unit is electrically connected with the positive terminal of the diode through the control switch Sx. The diode is sensitive to temperature. As the temperature of the surrounding environment changes, the current of the diode changes. In this way, the temperature of the surrounding environment can be measured.

Preferably, the control switches Sx correspond to the temperature sensitive units 111 one to one, namely one control switch is electrically connected with one temperature sensitive unit 111, to implement an accurate control. Specifically, in the embodiment, the number of the temperature sensitive units 111 is four. In such case, the processing unit 112 includes four control switches S1 to S4, and each control switch is electrically connected with a temperature sensitive unit 111 to control an electrical connection between the temperature sensitive unit 111 corresponding to the control switch and the processing unit 112. The control chip 120 may acquire a calibration value corresponding to the temperature sensitive unit 111 switched on by the closed control switch and adjust the calibration unit 1124 according to the calibration value, thereby calibrating the temperature sensitive unit 111.

For example, when an electric signal of the temperature sensitive unit 111 corresponding to the control switch S1 needs to be processed, the control switch S1 is closed, with the other control switches opened, to electrically connect the temperature sensitive unit 111 corresponding to the control switch S1 with the processing unit 112 to implement signal processing, and meanwhile, the control chip 120 acquires a calibration value corresponding to the temperature sensitive unit 111 switched on by the control switch S1 and adjusts the calibration unit 1124 according to the calibration value, thereby calibrating the temperature sensitive unit 111. When an electric signal of the temperature sensitive unit 111 corresponding to the control switch S2 needs to be processed, the control switch S2 is closed, with the other control switches opened, to electrically connect the temperature sensitive unit 111 corresponding to the control switch S2 with the processing unit 112 to implement signal processing, and meanwhile, the control chip 120 acquires a calibration value corresponding to the temperature sensitive unit 111 switched on by the control switch S2 and adjusts the calibration unit 1124 according to the calibration value, thereby calibrating the temperature sensitive unit 111. When an electric signal of the temperature sensitive unit 111 corresponding to the control switch S3 needs to be processed, the control switch S3 is closed, with the other control switches opened, to electrically connect the temperature sensitive unit 111 corresponding to the control switch S3 with the processing unit 112 to implement signal processing, and meanwhile, the control chip 120 acquires a calibration value corresponding to the temperature sensitive unit 111 switched on by the control switch S3 and adjusts the calibration unit 1124 according to the calibration value, thereby calibrating the temperature sensitive unit 111. When an electric signal of the temperature sensitive unit 111 corresponding to the control switch S4 needs to be processed, the control switch S4 is closed, with the other control switches opened, to electrically connect the temperature sensitive unit 111 corresponding to the control switch S4 with the processing unit 112 to implement signal processing, and meanwhile, the control chip 120 acquires a calibration value corresponding to the temperature sensitive unit 111 switched on by the control switch S4 and adjusts the calibration unit 1124 according to the calibration value, thereby calibrating the temperature sensitive unit 111.

In the embodiment, one terminal of the control switch Sx is electrically connected with the temperature sensitive unit 111, while an another terminal of the control switch Sx is connected with the calibration unit 1124. That is, the temperature sensitive unit 111 and the calibration unit 1124 are connected to both terminals of the control switch Sx respectively. In another embodiment of the disclosure, both the calibration unit 1124 and the temperature sensitive unit 111 are connected to the same terminal of the control switch Sx. That is, both the calibration unit 1124 and the temperature sensitive unit 111 are electrically connected with one terminal or another terminal of the control switch Sx. When the control switch Sx is closed, data of the temperature sensitive unit 111 is processed by the processing unit 112, and when the control switch Sx is opened, the processing unit 112 does not process the data of the temperature sensitive unit 111.

Furthermore, continuing to refer to FIG. 2, in the embodiment, the processing unit 112 further includes a fixed resistor Ra and an A/D conversion module 1121.

The fixed resistor Ra has a first terminal and a second terminal. The first terminal is electrically connected with a power source Vtemp, and the second terminal is electrically connected with the control switches Sx. The A/D conversion module 1121 has an input terminal and an output terminal, the input terminal is electrically connected with the second terminal of the fixed resistor Ra, the output terminal is configured to output a digital signal, and the A/D conversion module 1121 is configured to convert an analog signal of the second terminal of the fixed resistor Ra into a digital signal.

The A/D conversion module 1121 includes a resistor unit and multiple comparison units Px.

The resistor unit has a first terminal and a second terminal. The first terminal of the resistor unit is electrically connected with the power source. The same power source or different power sources may be adopted for the resistor unit and the temperature sensitive unit 111. For example, when the A/D conversion module 1121 is arranged in the memory chip 100, the same power source Vtemp may be adopted for the first terminal of the resistor unit and the temperature sensitive unit 111, and when the A/D conversion module 1121 is arranged in the control chip 120, different power sources may be adopted for the first terminal of the resistor unit and the temperature sensitive unit 111, in which a power source VDD may be adopted for the resistor unit. The second terminal of the resistor unit is electrically connected with the ground terminal VSS. The resistor unit has multiple leading-out terminals Ax, and voltages of the leading-out terminals Ax are different.

In the embodiment, the resistor unit includes multiple sub-resistors connected in series, and the numbers of the sub-resistors Rx between respective leading-out terminals Ax of the resistor unit and the second terminal of the resistor unit are different from each other, so that the voltages for the leading-out terminals Ax are different. For example, a leading-out terminal A1 is spaced from the second terminal of the resistor unit by the sub-resistor R1, and a leading-out terminal A2 is spaced from the second terminal of the resistor unit by the sub-resistors R1 and R2, so that voltages of the leading-out terminal A1 and the leading-out terminal A2 are different.

The number of the sub resistors Rx between the respective leading-out terminals Ax of the resistor unit and the second terminal of the resistor unit is progressively increased by a preset numerical value. The preset numerical value may be a fixed value, or may be a variable numerical value. Referring to FIG. 2, in the embodiment, the number of the sub resistors Rx between the respective leading-out terminals Ax of the resistor unit and the second terminal of the resistor unit is progressively increased by a fixed value of one. In another embodiment of the disclosure, the number may also be progressively increased by a fixed value of two, etc. When the preset numerical value is a variable numerical value, the preset numerical value has a change trend. The change trend is set according to a voltage increase amplitude of the leading-out terminal Ax. For example, the change trend of the preset numerical value is increasing when the voltage increase amplitude of the leading-out terminal Ax is increasing; the change trend of the preset numerical value is decreasing when the voltage increase amplitude of the leading-out terminal Ax is decreasing; and the change trend of the preset numerical value is first increasing and then decreasing when the voltage increase amplitude of the leading-out terminal Ax is first increasing and then decreasing.

Furthermore, the sub-resistors Rx have the same or different resistance values such that voltage increase amplitudes between the leading-out terminals Ax are the same or different. When the sub-resistors Rx have the same resistance value, the pattern layout difficulty may be reduced, and the pattern layout is simple and easy to implement, which facilitates manufacturing.

A signal of the input terminal of the A/D conversion module is taken as an input signal of the comparison unit Px, namely the analog signal output by the temperature sensitive unit is taken as the input signal of the comparison unit Px. Signals of the multiple leading-out terminals Ax of the resistor unit are taken as reference signals of the multiple comparison units Px respectively. The leading-out terminals Ax correspond to the comparison units Px one to one. For example, the signal of the leading-out terminal A1 is taken as the reference signal of the comparison unit P1, the signal of the leading-out terminal A2 is taken as the reference signal of the comparison unit P2, and so on. The leading-out terminals Ax correspond to the comparison units Px one to one. The comparison unit Px outputs a digital signal. The temperature, detected by the temperature sensitive unit 111, of the memory chip 100 may be obtained according to the digital signal output by the comparison unit Px.

When the number of the sub resistors Rx between the respective leading-out terminals Ax of the resistor unit and the second terminal of the resistor unit is progressively increased by a variable preset numerical value, the voltages of the leading-out terminals Ax change non-uniformly to change the reference signals of the multiple comparison units Px non-uniformly. In such case, increase amplitudes of the reference signals of the comparison units Px are different in different voltage regions, and the measurement accuracy of the voltage regions may further be changed. Specifically, for a voltage region required to be measured accurately, the preset numerical value is changed to a small extent, to make the increase amplitude of the reference signal low, increase the number of signal sampling points and further improve the measurement accuracy of the region. For a voltage region not required to be measured accurately, the preset numerical value is changed to a large extent, to make the increase amplitude of the reference signal high, reduce the number of signal sampling points and further improve the measurement accuracy. For example, in an embodiment of the disclosure, when the voltage of voltage region that needs to be accurately measured is ranged from 1.2 V to 1.7 V, and the corresponding reference signal range is 1.2 V to 1.7 V, in the voltage region in which the voltage is 1.2 V to 1.7 V, the increase amplitude of the preset numerical value is small, for example, the increase amplitude of the preset numerical value is 1, so that the increase amplitude of the reference signal is 0.1 V. In this case, the number of sampling points in this voltage region may be increased, and thus the measurement accuracy can be improved. In the voltage region in which the voltage is less than 1.2 V and greater than 1.7 V, the increase amplitude of the preset numerical value is large, for example, the increase amplitude of the preset value is 3, so that the increase amplitude of the reference signal is 0.3 V. In this case, by appropriately reducing the number of sampling points, the measurement efficiency can be improved.

Furthermore, the A/D conversion module 1121 further includes an output unit 1122, and the output unit 1122 is connected with the comparison units Px, and is configured to output the digital signal. Furthermore, in the embodiment, the A/D conversion module 1121 further includes an encoding unit EEC, the encoding unit EEC receives and codes the digital signal output by the comparison unit Px, a signal formed by the encoding unit is input to the output unit 1120, and the output unit 1122 outputs the coded digital signal.

Figure 5:
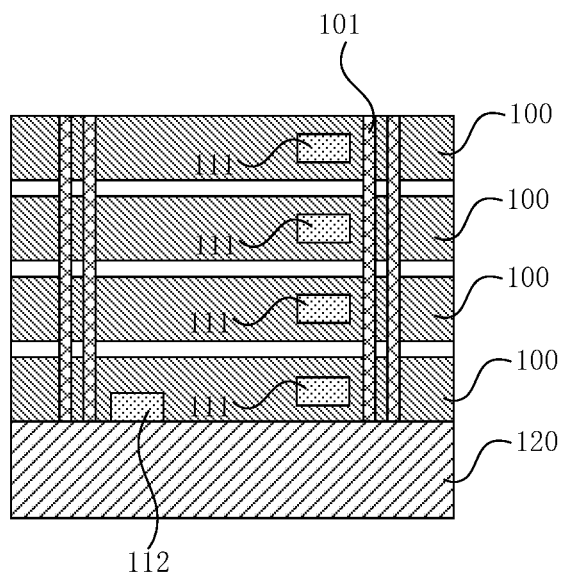
FIG. 5 is a structure diagram of a semiconductor device according to a third embodiment of the disclosure.

Furthermore, the processing unit 112 is arranged on the control chip 120 or arranged on one of the memory chips 100. In the embodiment, referring to FIG. 1, the processing unit 112 is arranged on the control chip 120. In another embodiment of the disclosure, the processing unit 112 is arranged on one of the memory chips 100. For example, as shown in FIG. 5, which shows a structure diagram of a semiconductor device according to a third embodiment of the disclosure, in this embodiment, the processing unit 112 is arranged on the bottom memory chip 100.

Figure 6:
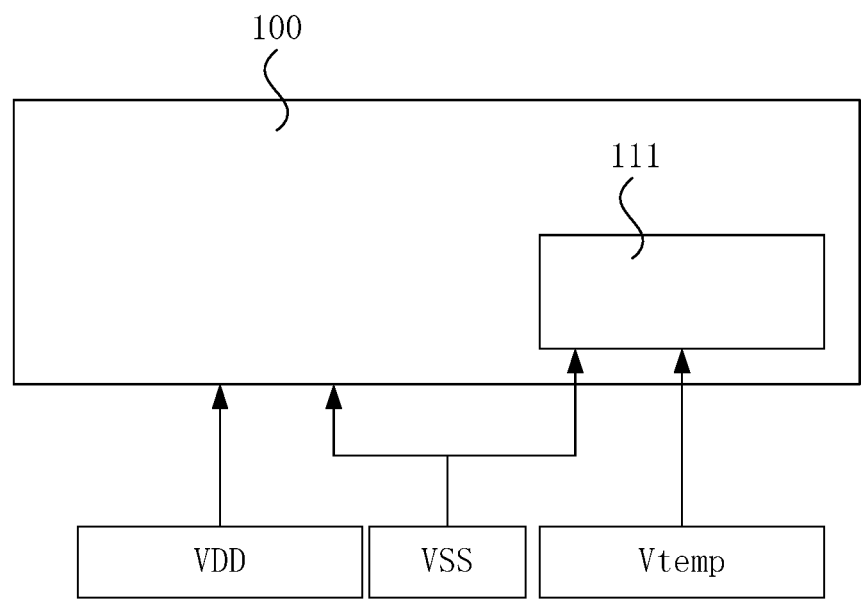
FIG. 6 is a schematic electrical connection diagram of the semiconductor device according to the first embodiment of the disclosure.

Furthermore, the temperature sensitive unit 111 and the memory chip 100 are powered by different power sources. FIG. 6 is a schematic electrical connection diagram of a first embodiment of a semiconductor device according to the disclosure. Referring to FIG. 6, a power supply of the temperature sensitive unit 111 is implemented by the power source Vtemp, and a power supply of the memory chip 100 is implemented by VDD. The ground terminal VSS, the power source VDD and the power source Vtemp are provided by the control chip 120. Since the power supply of the temperature sensitive unit 111 and power supply of the memory chip 100 are implemented by different power sources, the power supply to the temperature sensitive unit 111 and to the memory chip 100 may be controlled independently, so as to realize the starting of the temperature sensitive unit 111 and the memory chip 100 at different times.

Accordingly, in the disclosure, the starting of the temperature sensitive unit 111 and the starting of the memory chip 100 may be controlled respectively. That is, the starting of the temperature sensitive unit 111 is not affected by whether the memory chip 100 is started or not, and thus the detection of the temperature of the memory chip 100 is not affected by whether the memory chip 100 is started or not, so as to provide a reference for starting and running of the memory chip 100, thereby preventing the memory chip 100 from starting or running at a low temperature, and improving the stability of the memory chip 100.

As described above, the temperature greatly influences the performance of the memory chip 100, particularly when the memory chip 100 is started. When the memory chip 100 is started at a low temperature, the time for writing data into the memory chip 100 may change (for example, increase), which will affect the write stability of the memory chip 100. Therefore, the temperature of the memory chip needs to be measured before the memory chip 100 is started, so that the memory chip 100 may be started within a suitable temperature.

Therefore, in the disclosure, the power supply of the temperature sensitive unit 111 is earlier than the power supply of the memory chip 100. That is, the temperature sensitive unit 111 has been started before the memory chip 100 is started, so that a temperature of the memory chip before the memory chip 100 is started may be obtained to provide a reference for starting the memory chip 100. A power supply time difference between the temperature sensitive unit 111 and the memory chip 100 depends on a temperature change rate of the memory chip 100. When the temperature change rate of the memory chip 100 is large, and the time for the memory chip 100 to reach a preset temperature is short, the power supply time difference between the temperature sensitive unit 111 and the memory chip 100 is small. When the temperature change rate of the memory chip 100 is small, and the time for the memory chip 100 to reach the preset temperature is long, the power supply time difference between the temperature sensitive unit 111 and the memory chip 100 is large.

Furthermore, referring to FIG. 6, the temperature sensitive unit 111 shares the same ground terminal VSS with the memory chip 100, which has the advantages that on one hand, the leakage current of the memory chip 100 in a non-starting stage may not be increased, and on the other hand, the number of pins may be reduced to save the space.

Furthermore, continuing to referring to FIG. 1, a Through-Silicon-Via (TSV) interconnect structure 101 is formed in the memory chip 100. The memory chip 100 is electrically connected with the control chip 120 through the TSV interconnect structure 101 and the temperature detection unit 111 is electrically connected with the processing unit 112 through the TSV interconnect structure 101. Moreover, the memory chip 100 is electrically connected with the grounding terminal VSS and the power source VDD through the TSV interconnect structure 101 and the temperature detection unit 111 is electrically connected with the power source Vtemp and the grounding terminal VSS through the TSV interconnect structure 101.

In the first embodiment, when the multiple memory chips 100 are stacked on each other, the respective memory chips 100 may be connected with the control chip 120 through different TSV interconnect structures. When multiple temperature sensitive units 111 are provided, there may be a case where respective temperature sensitive units 111 are connected with the processing unit 112 through different TSV interconnect structures, and there may also be a case where the multiple temperature sensitive units 111 are connected with the processing unit 112 through a same TSV interconnect structure. It can be understood that the memory chip 100 and the temperature sensitive unit 111 are connected with the power sources through different TSV interconnect structures such that the temperature sensitive unit 111 and the memory chip 100 may be powered by different power sources. Furthermore, the power supply of the multiple temperature sensitive units 111 may also share the same TSV interconnect structure.

In another embodiment, the memory chip 100 and the temperature sensitive unit 111 may also be electrically connected with the control chip 120 and the processing unit 112 through metal leads (formed by a lead bonding process).

Figure 7:
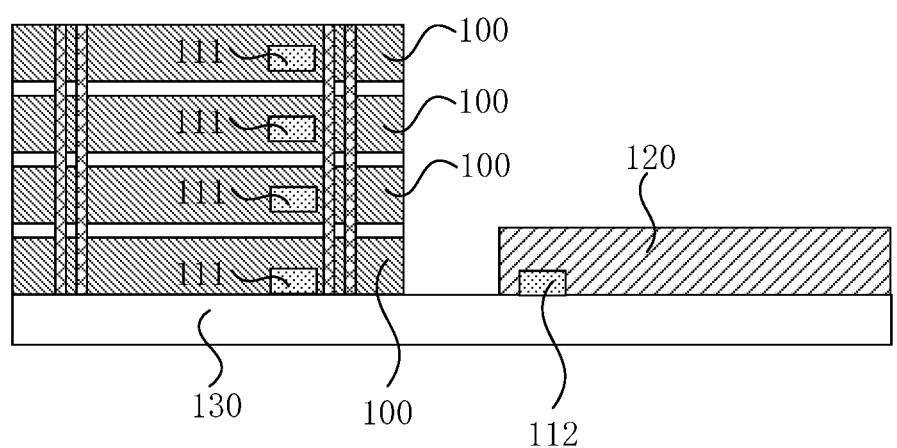
FIG. 7 is a structure diagram of a semiconductor device according to a fourth embodiment of the disclosure.

In the first embodiment, continuing to refer to FIG. 1, the multiple memory chips 100 are sequentially stacked on the control chip 120, and the control chip 120 is bonded with the bottommost memory chip 100 in the stack. In another embodiment of the disclosure, referring to FIG. 7, which is a structure diagram of a semiconductor device according to a fourth embodiment of the disclosure, the semiconductor device further includes a circuit substrate 130, in which a connecting circuit (not shown in the figure) is formed. Both the memory chip 100 and the control chip 120 are located on the circuit substrate 130, and the memory chip 100 is connected with the control chip 120 through the connecting line in the circuit substrate 130. In the embodiment, the temperature sensitive unit 111 is arranged in the memory chip 100, and the processing unit 112 is arranged in the control chip 120. The circuit substrate 130 includes, but not limited to, a Printed Circuit Board (PCB).

The semiconductor device of the disclosure detects the temperatures of the memory chips using the temperature detection module, When the temperature detected by the temperature detection module reaches a set threshold or after the temperature of the memory chip 100 reaches the set threshold, the memory chip is started. The temperature detected by the temperature detection circuit provides a reference for starting and running the memory chip, thereby preventing the memory chip from starting and running at a low temperature, shortening the writing time, and improving the writing stability of the memory chip.

When the memory chip 100 is heated in a low-temperature environment, the temperature of the memory chip 100 may be increased rapidly, thereby accelerating starting of the memory chip 100. Therefore, in the disclosure, the control chip 120 may also be started at first before the memory chip 100 is started, and the control chip 120 uses the heat generated by itself after starting, to heat the memory chip 100 so as to increase the temperature of the memory chip 100 rapidly.

After the control chip 120 is started, the control chip 120 controls the temperature sensitive unit 111 to start, to detect the temperature of the memory chip 100. The temperature sensitive unit 111 may further transmit the detected temperature to the control chip 120 to serve as data of the control chip 120.

The control chip 120 may determine whether the temperature detected by the temperature sensitive unit reaches a set threshold or not, and when the temperature detected by the temperature sensitive unit reaches the set threshold, the control chip controls the memory chip 100 to start.

In the case that one temperature sensitive unit 111 detects temperatures of multiple memory chips 100, the control chip 120, in responsive to determining that the temperature detected by the temperature sensitive unit 111 reaches the set threshold, controls the memory chip 100 closest to the control chip 120 to start at first, and then controls the other memory chips 100 above the memory chip 100 closest to the control chip to start sequentially.

In the case that the temperature sensitive units 111 correspond to the memory chips 100 one to one, the control chip 120, in responsive to determining that the temperature detected by a certain temperature sensitive unit 111 reaches the set threshold, controls the memory chip 100 corresponding to temperature sensitive unit 111 to start. Specifically, the stack shown in FIG. 1 includes four memory chips 100, and each of the memory chips 100 is correspondingly provided with one temperature sensitive unit 111, so that each temperature sensitive unit 111 may detect a temperature of the corresponding memory chip 100, to obtain four detected temperature values. The control chip 120 may sequentially determine whether the temperatures detected by the four temperature sensitive units 111 reach the set threshold or not. When the temperature detected by a certain temperature sensitive unit 111 reaches the set threshold, the control chip controls the memory chip corresponding to the temperature sensitive unit 111 to start. For example, when the temperature detected by the temperature sensitive unit 111 in the bottommost memory chip 100 in the stack reaches the set threshold at first, the control chip 120 may control the bottommost memory chip 100 in the stack to start at first. Then, when the temperature detected by the temperature sensitive unit 111 corresponding to a second memory chip 100 from the bottommost memory chip in the stack also reaches the set threshold, a control unit 301 controls the second memory chip 100 from the bottommost memory chip in the stack to start. The starting of the memory chips 100 in the upper two layers may be implemented by analogy.

When a semiconductor device includes multiple memory chips 100, through the abovementioned control structure and control manner, the accuracy of start timing of each memory chip 100 may further be improved, writing time for writing data into each memory chip 100 in a low-temperature environment may further be shortened, and the writing stability of each memory chip 100 is further improved.

When the semiconductor device of the disclosure works in a low-temperature environment, the memory chip 100 may be heated to the set threshold through the control chip 120, so that resistance of the bit line, word line and metal connecting wire (metal contact portion) in the memory chip 100 may be prevented from being increased due to too low ambient temperature, thereby shortening the writing time for writing data into the memory chip in the low-temperature environment, and improving the writing stability of the memory chip. The set threshold may be set in the control chip 120. A specific value of the set threshold may be set according to a practical requirement or experiences.

In another embodiment, there may be an additional heating circuit (not shown in the figure) in the control chip 120. The heating circuit is configured to heat the memory chip 100. Before or after the control chip 120 heats the memory chip 100, the control chip 120 determines whether the temperature, detected by the temperature sensitive unit 111, of the memory chip 100 reaches the set threshold or not. When the temperature does not reach the set threshold, the control chip 120 controls the heating circuit to heat the memory chip 100. When the temperature reaches the set threshold, control chip 120 controls the heating circuit to stop heating the memory chip 100. Therefore, a heating process may be controlled accurately to keep the temperature of the memory chip 100 near the set threshold, to prevent the temperature of the memory chip 100 from being too high or too low and further ensure that the writing time of the memory is always relatively short.

The above embodiments are only the preferred implementation modes of the disclosure. It is noted that those of ordinary skill in the art may further make several improvements and embellishments without departing from the principle of the disclosure, and these improvements and embellishments shall also be regarded as falling within the scope of protection of the disclosure.

The invention claimed is:

1. A semiconductor device, comprising a plurality of memory chips and a temperature detection circuit, the temperature detection circuit comprising:
a plurality of temperature sensitive elements, arranged on at least part of the memory chips to detect temperatures of the at least part of the memory chips; and
processor, wherein the plurality of temperature sensitive elements share the processor with each other, the processor is configured to process a signal of at least one of the temperature sensitive elements, the processor comprises a calibration value memory cell and a calibrator, the calibration value memory cell being configured to store a calibration value corresponding to the temperature sensitive element, and the calibrator being configured to calibrate the temperature sensitive element according to the calibration value.

2. The semiconductor device of claim 1, wherein the calibrator is an adjustable resistor, and is connected in parallel with the temperature sensitive elements, and a resistance value of the calibrator is adjusted according to the calibration value to calibrate the temperature sensitive elements.

3. The semiconductor device of claim 2, wherein the calibrator comprises a plurality of sub-resistors and a plurality of switches, the sub-resistors being connected in series, and each of the switches being connected with at least one of the sub-resistors, and wherein the resistance value of the calibrator is changed by changing on/off states of the plurality of switches.

4. The semiconductor device of claim 3, wherein the on-off state of the switch is controlled according to the calibration value.

5. The semiconductor device of claim 2, wherein the temperature sensitive element is a diode, the diode having a negative terminal electrically connected with a ground terminal and a positive terminal electrically connected with the processor, and wherein the calibrator is connected in parallel with the diode and has a terminal electrically connected with the ground terminal and an another terminal electrically connected with the positive terminal of the diode.

6. The semiconductor device of claim 1, wherein the temperature detection circuit further comprises a non-volatile memory cell, the non-volatile memory cell being connected with the calibration value memory cell and being configured to back up the calibration value, and wherein the calibration value backed up in the non-volatile memory cell is allowed to be reloaded into the calibration value memory cell.

7. The semiconductor device of claim 1, wherein the processor comprises at least one control switch, and the control switch is electrically connected with the temperature sensitive element to select the temperature sensitive element with a signal needing to be processed by the processor.

8. The semiconductor device of claim 7, wherein the processor further comprises a fixed resistor, the fixed resistor having a first terminal electrically connected with a power source and a second terminal electrically connected with the control switch.

9. The semiconductor device of claim 8, wherein the processor further comprises an Analog/Digital (A/D) conversion circuit, the A/D conversion circuit having an input terminal electrically connected with the second terminal of the fixed resistor and an output terminal configured to output a digital signal, and the A/D conversion circuit being configured to convert an analog signal of the second terminal of the fixed resistor into a digital signal.

10. The semiconductor device of claim 9, wherein the A/D conversion circuit comprises:
a resistor set having a first terminal and a second terminal, wherein the first terminal of the resistor set is electrically connected with the power source, the second terminal of the resistor set is electrically connected with a ground terminal, the resistor set has a plurality of leading-out terminals, and voltages of the leading-out terminals are different; and
a plurality of comparators, wherein a signal of the input terminal of the A/D conversion circuit is taken as an input signal of the comparator, signals of the plurality of leading-out terminals of the resistor set are taken as reference signals of the a plurality of comparators respectively, and the comparators outputs digital signals.

11. The semiconductor device of claim 10, wherein the resistor set comprises a plurality of sub-resistors connected in series, and the numbers of the sub-resistors between respective leading-out terminals of the resistor set and the second terminal of the resistor set are different from each other, so that the voltages of the respective leading-out terminals are different from each other.

12. The semiconductor device of claim 1, wherein the temperature sensitive elements correspond to the memory chips one to one, each of the memory chips being provided with one of the temperature sensitive elements.

13. The semiconductor device of claim 1, wherein the temperature sensitive element shares a same ground terminal with the memory chip.

14. The semiconductor device of claim 1, further comprising a control chip, wherein the memory chips and the temperature detection circuit are electrically connected with the control chip.

15. The semiconductor device of claim 14, wherein the processor is arranged on the control chip or arranged on one of the memory chips.

16. The semiconductor device of claim 14, wherein the plurality of memory chips are sequentially stacked upwards on the control chip.

17. The semiconductor device of claim 14, further comprising a circuit substrate, wherein a connecting circuit is formed in the circuit substrate, both the memory chip and the control chip are arranged on the circuit substrate, and the memory chip is connected with the control chip by the connecting circuit in the circuit substrate.

18. The semiconductor device of claim 14, wherein the control chip is configured to heat the memory chip before the memory chip is started, and determine whether a temperature detected by the temperature sensitive element reaches a set threshold or not, and wherein the control chip is configured to control the memory chip to start when the temperature detected by the temperature sensitive element reaches the set threshold.

19. The semiconductor device of claim 1, wherein a power supply of the temperature sensitive element and a power supply of the memory chip are implemented by different power sources.

20. The semiconductor device of claim 19, wherein the power supply of the temperature sensitive element is earlier than the power supply of the memory chip.

* * * * *